(12) United States Patent
Nishikawa (10) Patent No.: US 7,535,816 B2
(45) Date of Patent: May 19, 2009

(54) WAVEFORM EQUALIZER AND INFORMATION REPRODUCING APPARATUS THEREWITH

(75) Inventor: Koji Nishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 248 days.

(21) Appl. No.: 10/588,638

(22) PCT Filed: Feb. 25, 2005

(86) PCT No.: PCT/JP2005/003180

§ 371 (c)(1),
(2), (4) Date: Aug. 4, 2006

(87) PCT Pub. No.: WO2005/083883

PCT Pub. Date: Sep. 9, 2005

(65) Prior Publication Data

US 2007/0176684 A1    Aug. 2, 2007

(30) Foreign Application Priority Data

Mar. 2, 2004   (JP)   .............................. 2004-057019

(51) Int. Cl.
*G11B 7/00* (2006.01)
*H03G 11/04* (2006.01)

(52) U.S. Cl. .................................. 369/124.13; 333/18

(58) Field of Classification Search ........................ None
See application file for complete search history.

(56) References Cited

U.S. PATENT DOCUMENTS

| | | | | |
|---|---|---|---|---|
| 4,817,073 A | * | 3/1989 | Suzuki | 369/44.28 |
| 5,258,716 A | * | 11/1993 | Kondo et al. | 330/85 |
| 5,463,504 A | * | 10/1995 | Kimura et al. | 360/65 |
| 5,808,979 A | | 9/1998 | Ishibashi et al. | |
| 2003/0137912 A1 | * | 7/2003 | Ogura | 369/47.39 |

FOREIGN PATENT DOCUMENTS

| | | |
|---|---|---|
| JP | 08-147724 | 6/1996 |
| JP | 08-162902 | 6/1996 |
| JP | 08-307208 | 11/1996 |
| JP | 2001-023167 | 1/2001 |
| JP | 2002-269925 | 9/2002 |

* cited by examiner

Primary Examiner—Peter Vincent Agustin
(74) Attorney, Agent, or Firm—Fish & Richardson P.C.

(57) ABSTRACT

A waveform equalizer includes: a calculation circuit (7a) that permits free setting of the boost factor by which the gain, in a predetermined frequency range, for the input signal by varying the boost factor; and an all-pass filter (7b) that is connected to the stage preceding or following the calculation circuit, that has a first conductance amplifier and a second conductance amplifier, and that adjusts and thereby corrects the group delay characteristic of the input signal by varying the conductance of at least one of the first and second conductance amplifiers.

8 Claims, 6 Drawing Sheets

PRIOR ART
FIG.7

WAVEFORM EQUALIZER AND INFORMATION REPRODUCING APPARATUS THEREWITH

TECHNICAL FIELD

The present invention relates to a waveform equalizer that performs equalization on a signal fed thereto, and also relates to an information reproducing apparatus, incorporating such a waveform equalizer, that reproduces information stored on an optical disc or the like.

BACKGROUND ART

Conventionally, information reproducing apparatuses that use as a recording medium a magnetic disc such as a hard disc or an optical disc such as a compact disc (CD) have been used in computer external storage apparatuses, audio appliances, and the like.

In general, the higher the frequency of a signal reproduced from an optical disc or the like, the smaller its amplitude compared with in a low-frequency range (for example, 1 MHz or lower). That is, the reproduced signal tends to be weaker in a high-frequency range (for example, about 100 MHz or higher). This weakening of the reproduced signal occurs, for example in the case of an optical disc reproducing apparatus, due to, among other factors, the response characteristics of the optical pickup that detects in the form of an optical signal the information stored on an optical disc and the response characteristics of the circuit that converts the optical signal into an electrical signal. To make the weakened amplitude in the high-frequency range equal to the amplitude in the low-frequency range, it is conventionally common to raise the gain in the high-frequency range (hereinafter referred to as "boost"), thereby to achieve "equalization".

Usually, the factor by which the high-frequency range is boosted (that is, the gain in the high-frequency range relative to the gain in the low-frequency range) in such equalization can be freely set by a control circuit or the like provided in an information reproducing apparatus. Thus, the factor by which the high-frequency range is boosted is so adjusted as to make the weakened amplitude of the reproduced signal in the high-frequency range equal to its amplitude in the low-frequency range. This contributes to an enhancement of the accuracy (that is, a reduction of read errors) with which the information recorded on a recording medium such as an optical disc is read.

Figure 6:
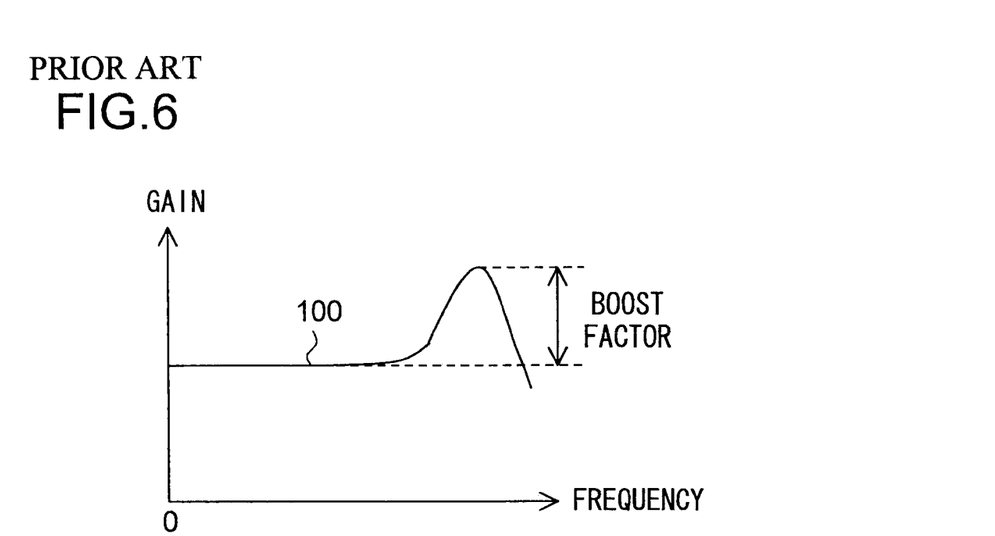
[FIG. 6] A diagram showing a characteristic of an equi-ripple filter conventionally used in a waveform equalizer.
Figure 7:
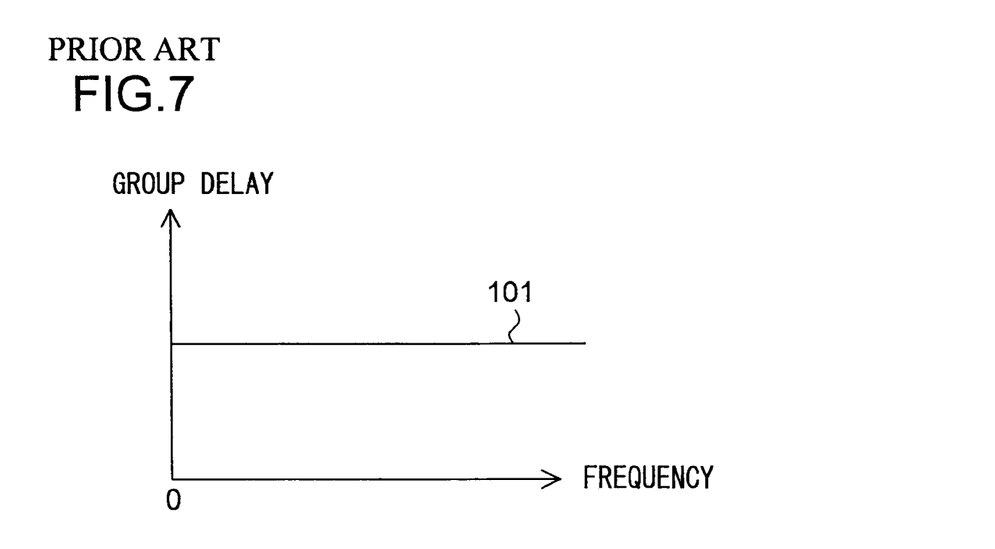
[FIG. 7] A diagram showing a characteristic of an equi-ripple filter conventionally used in a waveform equalizer.

The boost factor is adjusted, typically, by the use of an equi-ripple filter or the like. FIGS. 6 and 7 show the characteristics of an equi-ripple filter. As indicated by line 100 in FIG. 6, the gain in the high-frequency range is higher than in the low-frequency range. Moreover, as indicated by line 101 in FIG. 7, the group delay does not depend on frequency (that is, the phase-to-frequency characteristic is linear). Thus, between the input and output waveforms of the equi-ripple filter, there is no change in the group delay difference between the different frequency ranges.

DISCLOSURE OF THE INVENTION

Problems to be Solved by the Invention

On the other hand, in recent years, with respect to the reproduction of the information recorded on a recording medium such as an optical disc, increasingly high reproduction rates have been sought. An attempt for a higher reproduction rate suffers from a comparatively large group delay difference in the reproduced signal, between the group delay in the low-frequency range (for example, 1 MHz or lower) and the group delay in the high-frequency range (for example, about 100 MHz or higher) (usually, the group delay in the high-frequency range is smaller than the group delay in the low-frequency range).

The group delay difference arises due to complex factors including those intrinsic to the integrated circuit (IC) incorporating a circuit that performs the above-mentioned equalization and those extrinsic to the IC, such as the response characteristics of the optical pickup mechanism. With the conventional equalization using an equi-ripple filter alone, not only is it difficult to correct for the group delay difference (that is, to eliminate or reduce it), but also the distortion produced by the group delay difference in the waveform of the reproduced signal deteriorates the accuracy (that is, increases read errors) with which the information recorded on a recording medium such as an optical disc is read.

In view of the conventionally encountered inconveniences mentioned above, it is an object of the present invention to provide a waveform equalizer and an information reproducing apparatus that permit independent adjustment of the gain in the weakened frequency range and of the group delay and that permit easy equalization of a signal.

Means for Solving the Problem

To achieve the above object, according to the present invention, a waveform equalizer is provided with: a calculation circuit that permits free setting of the boost factor by which the gain, in a predetermined frequency range, for the input signal to the waveform equalizer is adjusted and that adjusts the gain for the input signal by varying the boost factor; and an all-pass filter that is connected to the stage preceding or following the calculation circuit, that has a first conductance amplifier and a second conductance amplifier, and that adjusts and thereby corrects the group delay characteristic of the input signal by varying the conductance of at least one of the first and second conductance amplifiers.

With this configuration, it is possible to perform independently the adjustment of the gain for the input signal weakened in a high-frequency range and the adjustment for the correction of the group delay characteristic. Moreover, since these adjustments can be performed independently, it is easy to perform the adjustment for the equalization of the input signal to the waveform equalizer.

To realize the above configuration, preferably, the all-pass filter further has: a differentiator that is connected between the input and output circuits of the first conductance amplifier and that includes a first capacitor; and a second capacitor that is connected between the input side of the first conductance amplifier and the output side of the second conductance amplifier.

To realize the above configuration, preferably, the input voltage to the all-pass filter is fed to one input terminal of the first conductance amplifier; the voltage applied to the output terminal of the first conductance amplifier is fed to one input terminal of the second conductance amplifier; the voltage applied to the output terminal of the second conductance amplifier, which voltage corresponds to the output voltage of the all-pass filter, is fed to the other input terminal of the first conductance amplifier and to the other input terminal of the second conductance amplifier; and the input voltage to the all-pass filter and the voltage applied to the output terminal of the first conductance amplifier have phases inverted relative to each other.

Preferably, the all-pass filter keeps the conductance of the first conductance amplifier constant and makes the conductance of the second conductance amplifier variable, and, by varying the conductance of the second conductance amplifier, adjusts and thereby corrects the group delay characteristic of the input signal while keeping the group delay of the input signal in a direct-current range constant.

With this configuration, it is possible, while keeping the group delay in the direct-current range constant, to easily adjust the group delay in a high-frequency range alone. Moreover, since the conductance of the first conductance amplifier no longer needs to be made variable, it is possible to reduce the circuit scale of the first conductance amplifier, and hence to reduce the circuit scale of the waveform equalizer. Moreover, since the first conductance amplifier no longer needs to be controlled from outside, it is possible to omit the wiring therefore and to simplify the control operation therefore.

Alternatively, preferably, the all-pass filter makes the conductance of the first conductance amplifier variable, and, by varying the conductance of the first conductance amplifier, varies the frequency range in which the group delay characteristic of the input signal is corrected.

In a case where the frequency range in which the group delay characteristic is corrected is inconstant, by varying the conductance of the first conductance amplifier, it is possible to easily adjust the group delay.

Preferably, the calculation circuit is built as an equi-ripple filter.

Since the phase-to-frequency characteristic of an equi-ripple filter is linear, its use makes it easy to perform the adjustment for the equalization of the input signal.

To achieve the above object, according to the present invention, an information reproducing apparatus is provided with: a detector that detects information recorded on a recording medium and that then converts the detected information into an electrical signal; an waveform equalizer that receives as the input signal thereto the electrical signal; and a processing circuit that processes the output from the waveform equalizer. Here, used as the waveform equalizer is one of the waveform equalizers described above, and the information reproducing apparatus is further provided with a controller that sets the boost factor and that sets whichever of the conductances of the first and second conductance amplifiers is made variable.

Advantages of the Invention

As described above, a waveform equalizer and an information reproducing apparatus according to the present invention permit independent adjustment of the gain in the weakened frequency range and of the group delay, and permit easy equalization of a signal.

| List of Reference Symbols | |
|---|---|
| 1 | CD Reproducing Apparatus |
| 2 | CD |
| 3 | Spindle Motor |
| 4 | Optical Pickup |
| 5 | Detector |
| 6 | RF Amplifier |
| 7 | Waveform Equalization Section |
| 7a | Equi-ripple Filter |
| 7b, 67b | All-pass Filter |
| 8 | A/D Converter |
| 9 | Signal Processor |
| 10 | Driver |
| 11 | CPU |
| 22, 23 | Variable-conductance Amplifier |
| 70, 71 | Differential-input Differential-output Variable-conductance Amplifier |
| 24 | Inverter |
| 25, 26, 72, 73, 74, 75 | Capacitor |
| 20, 21, 60, 61, 62, 63 | Terminal |

BEST MODE FOR CARRYING OUT THE INVENTION

Figure 1:
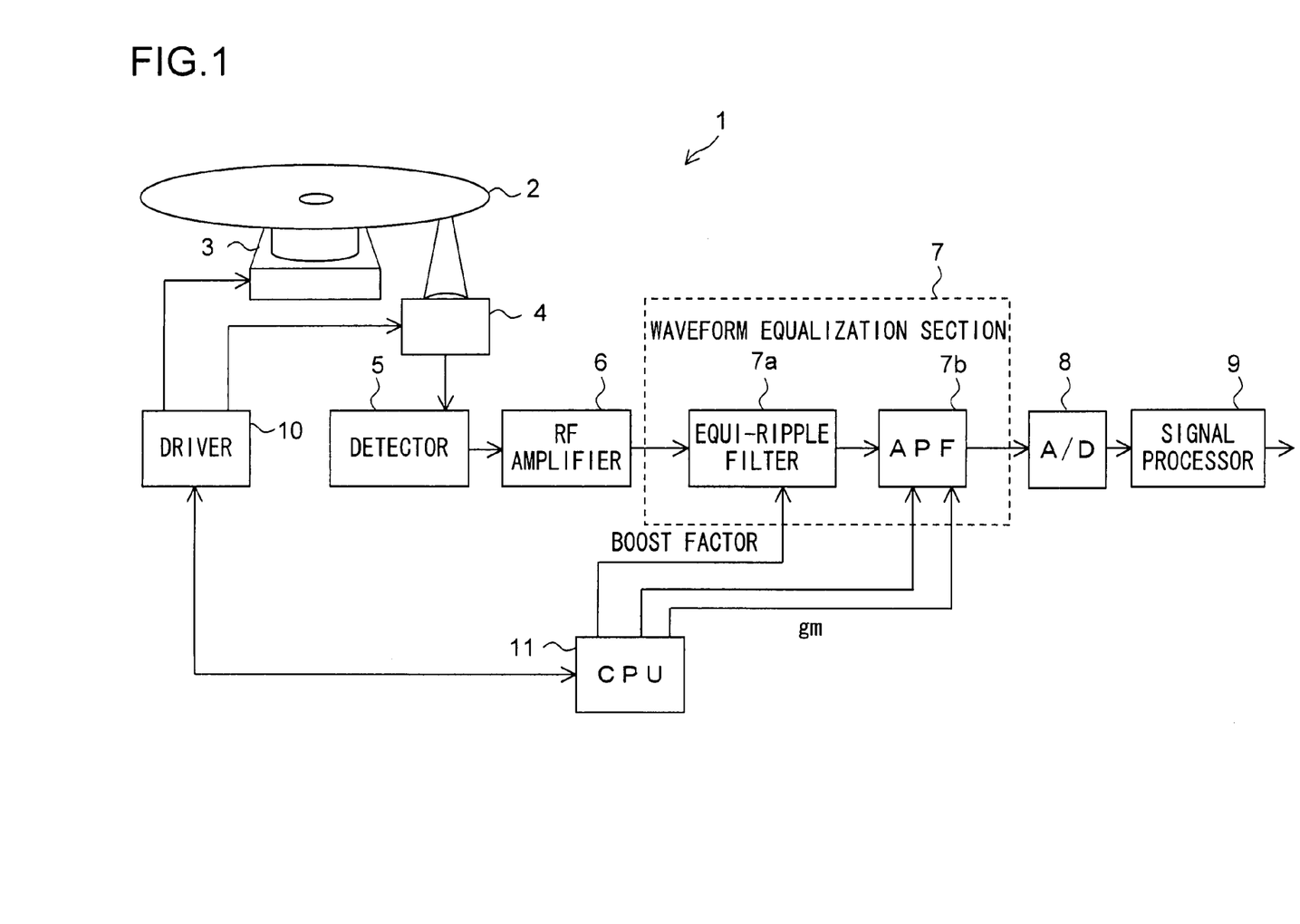
[FIG. 1] A block diagram of a CD reproducing apparatus embodying the present invention.

Hereinafter, a waveform equalizer and an information reproducing apparatus embodying the present invention will be described with reference to the accompanying drawings. FIG. 1 shows the configuration of a CD reproducing apparatus as an example of an information reproducing apparatus.

(FIG. 1: Outline of the CD Reproducing Apparatus)

Referring to FIG. 1, reference numeral 2 represents a compact disc (CD) as a recording medium, and the CD reproducing apparatus 1 is composed essentially of the following components. A spindle motor 3 drives the CD 2 to rotate. An optical pickup 4 reads, by the use of laser light, the information recorded on the CD 2. A detector 5 converts the optical signal detected by the optical pickup 4 into an electrical signal, and then outputs it as an RF (radio-frequency) signal. An RF amplifier 6 amplifiers the RF signal. An equi-ripple filter 7a boosts a high-frequency range of the amplified RF signal outputted from the RF amplifier 6, and thereby adjust the gain in the high-frequency range. An all-pass filter 7b corrects the group delay characteristics (eliminates the group delay difference between different frequency ranges) of the signal outputted from the equi-ripple filter 7a. An A/D converter 8 binalizes the equalization signal outputted from the all-pass filter 7b. A signal processor 9 that processes the digital signal from the A/D converter 8 to itself use the information recorded on the CD 2 or feed it to an unillustrated memory or the like. A driver 10 controls the servo mechanisms of the spindle motor 3 and of the optical pickup 4. A CPU (central processing unit) 11 controls the equi-ripple filter 7a, the all-pass filter 7b, and the driver 10. The CPU 11, which has just been described as controlling the equi-ripple filter 7a, the all-pass filter 7b, and the driver 10 may be replaced with anything else (for example, an MPU (microprocessing unit)) that functions in a similar manner.

The CPU 11 outputs a signal that determines the boost factor of the equi-ripple filter 7a, and also outputs a signal that determines the characteristics of the all-pass filter 7b. The equi-ripple filter 7a and the all-pass filter 7b together constitute a waveform equalization section 7 that equalizes the waveform of the amplified RF signal outputted from the RF amplifier 6 and outputs an equalized signal. The equi-ripple filter 7a has the same characteristics as shown in FIGS. 6 and 7, and therefore no explanation thereof will be repeated.

Figure 2:
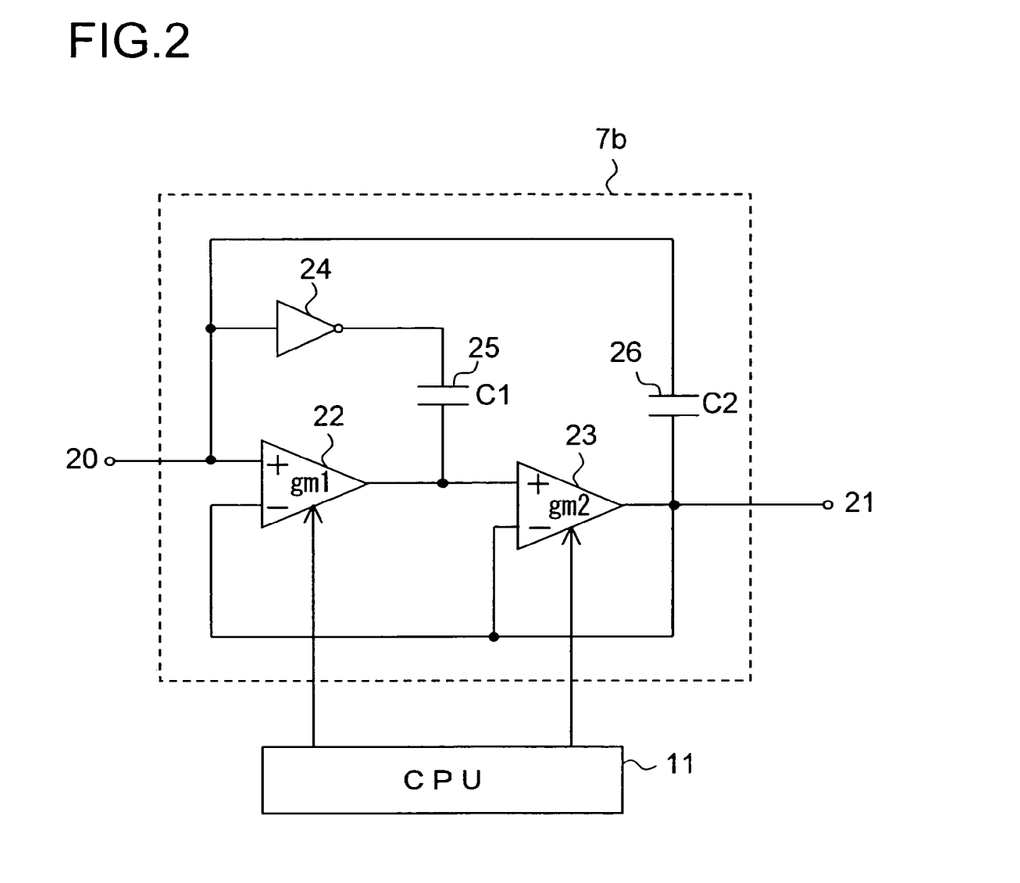
[FIG. 2] A circuit configuration diagram of the all-pass filter shown in FIG. 1.

(FIG. 2: Configuration and Operation of the All-Pass Filter)

Next, referring to FIG. 2, the circuit configuration of the all-pass filter 7*b* will be described. The all-pass filter 7*b* has two variable-conductance amplifiers (hereinafter referred to simply as "gm amplifiers") 22 and 23. The conductances gm1 and gm2 of these gm amplifiers 22 and 23, respectively, can be individually set freely through current control or voltage control from the CPU 11. The output voltage of the equi-ripple filter 7*a* is fed, via a terminal 20, to the positive (non-inverting) input terminal (+) of the gm amplifier 22, to the input terminal of an inverter 24, and to one end of a capacitor 26. The other end of the capacitor 26 is connected to the output terminal and the negative (inverting) input terminal (−) of the gm amplifier 23 and to the negative input terminal (−) of the gm amplifier 22. The output terminal of the inverter 24 is connected, via a capacitor 25, to the output terminal of the gm amplifier 22 and to the positive input terminal (+) of the gm amplifier 23. The voltage applied to the output terminal of the gm amplifier 23 is fed, via a terminal 21, to the A/D converter 8 (see FIG. 1). The inverter 24 and the capacitor 25 together constitute a differentiator.

Configured as described above, the all-pass filter 7*b* constitutes a second-order all-pass filter. In general, the transfer function T(s) of a second-order all-pass filter is expressed by formula (1) below.

[Formula 1]

$$T(s) = \frac{s^2 - \frac{\omega o}{Q}s + \omega o^2}{s^2 + \frac{\omega o}{Q}s + \omega o^2} = \frac{\omega o^2 - \omega^2 - j\frac{\omega o}{Q}\omega}{\omega o^2 - \omega^2 + j\frac{\omega o}{Q}\omega} \quad (1)$$

Here, Q represents the quality factor, "s" represents the Laplace operator, ωo represents the natural angular frequency, and ω represents the angular frequency. As will be understood from this transfer function T(s), the gain of a second-order all-pass filter like the all-pass filter 7*b* does not depend on frequency, but remains equal to 1. Here, the phase θ in the function T(s) is expressed by formula (2) below.

[Formula 2]

$$\theta = 2\tan^{-1}\left(\frac{\omega o}{Q} \cdot \frac{\omega}{\omega o^2 - \omega^2}\right) \quad (2)$$

Hence, let the group delay be GD, then formula (3) below holds.

[Formula 3]

$$GD = -\frac{\partial \theta}{\partial \omega} = \frac{2Q\omega o(\omega^2 + \omega o^2)}{Q^2(\omega^2 - \omega o^2)^2 + \omega^2 \omega o^2} \quad (3)$$

Furthermore, let the group delay in the direct-current region be $GD_{\omega o}$, then formula (4) below holds (substituting ω=0 in formula (3) above gives $GD_{\omega o}$).

[Formula 4]

$$GD_{\omega o} = \frac{2}{Q\omega o} \quad (4)$$

Here, let the capacitances of the capacitors 25 and 26 in FIG. 2 be C1 and C2, respectively. Then the transfer function T(s) of the all-pass filter 7*b* is expressed by formula (5) below.

[Formula 5]

$$T(s) = \frac{\frac{gm1\,gm2}{C1C2} - \frac{gm2}{C2}s + s^2}{s^2 + \frac{gm2}{C2}s + \frac{gm1\,gm2}{C1C2}} \quad (5)$$

Comparing this formula (5) with formula (1), which expresses the transfer function of a common second-order all-pass filter, gives formulae (6) and (7) below.

[Formula 6]

$$\omega o = \sqrt{\frac{gm1\,gm2}{C1C2}} \quad (6)$$

[Formula 7]

$$Q = \sqrt{\frac{gm1}{gm2} \cdot \frac{C2}{C1}} \quad (7)$$

Substituting formulae (6) and (7) above in formula (4) above shows that the group delay $GD_{\omega o}$ in the direct-current region equals 2C1/gm1, and thus does not depend on the conductance gm2 of the gm amplifier 23. That is, by keeping the conductance gm1 of the gm amplifier 22 constant and varying the conductance gm2 of the gm amplifier 23, it is possible to keep the group delay, in the direct-current region, of the signal inputted to the all-pass filter 7*b* constant and thereby to easily adjust the group delay in a high-frequency range only. Put otherwise, since the phase-to-frequency characteristic of the equi-ripple filter 7*a* is linear, by keeping the conductance gm1 of the gm amplifier 22 constant and varying the conductance gm2 of the gm amplifier 23, it is possible, while keeping the group delay, in the direct-current region, of the signal inputted to the waveform equalization section 7 constant, to adjust the group delay in a high-frequency range only.

If the conductance gm1 of the gm amplifier 22 may be kept constant, and thus does not need to be varied at all, the gm amplifier 22 may be built as, instead of a variable-conductance amplifier, a conductance amplifier having a constant conductance. This not only helps reduce the circuit scale of the gm amplifier 22, but also helps eliminate the need for the CPU 11 to control the gm amplifier 22, and thus helps omit the wiring needed for such control and simplify the operation of the CPU 11 therefore.

Figure 3:
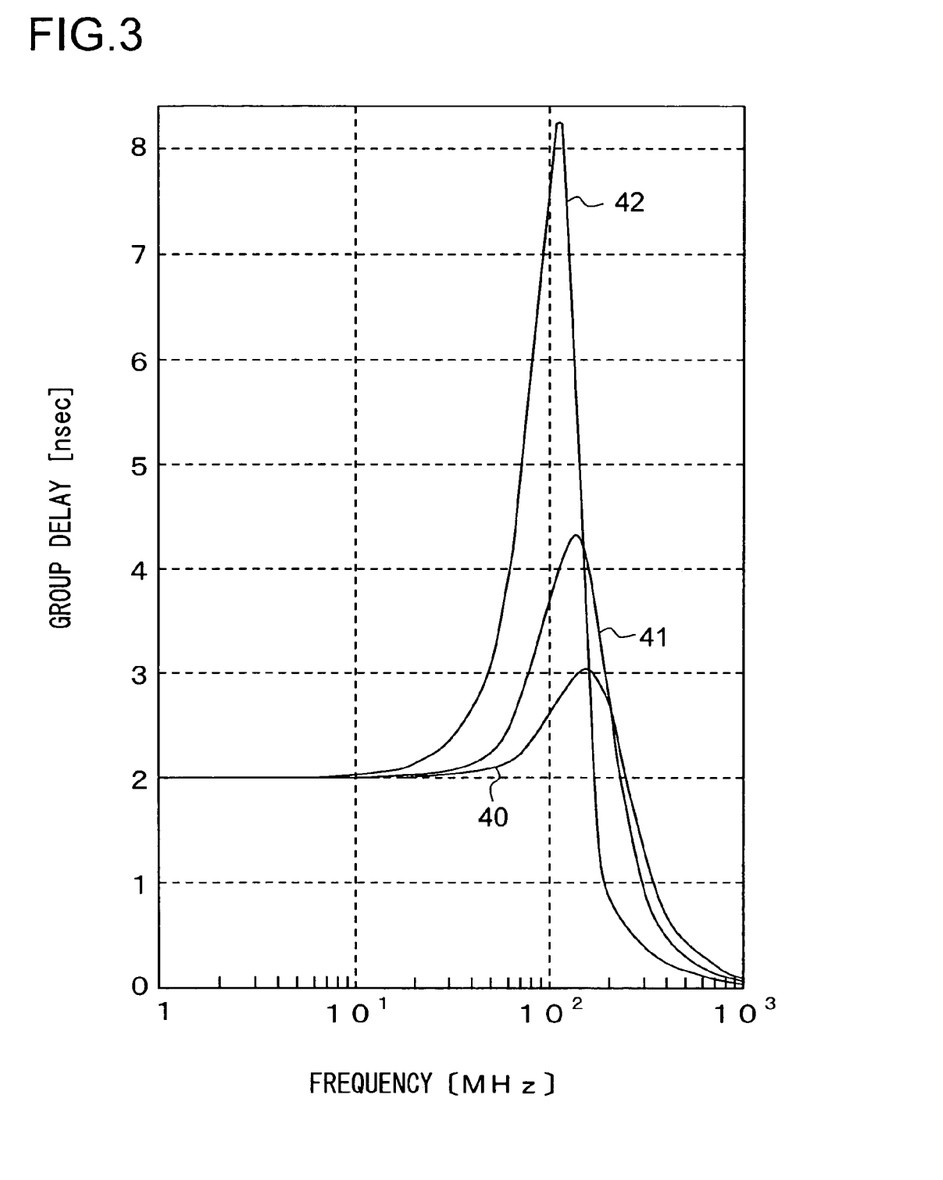
[FIG. 3] A diagram showing group delay characteristics of the all-pass filter shown in FIG. 1.
Figure 4:
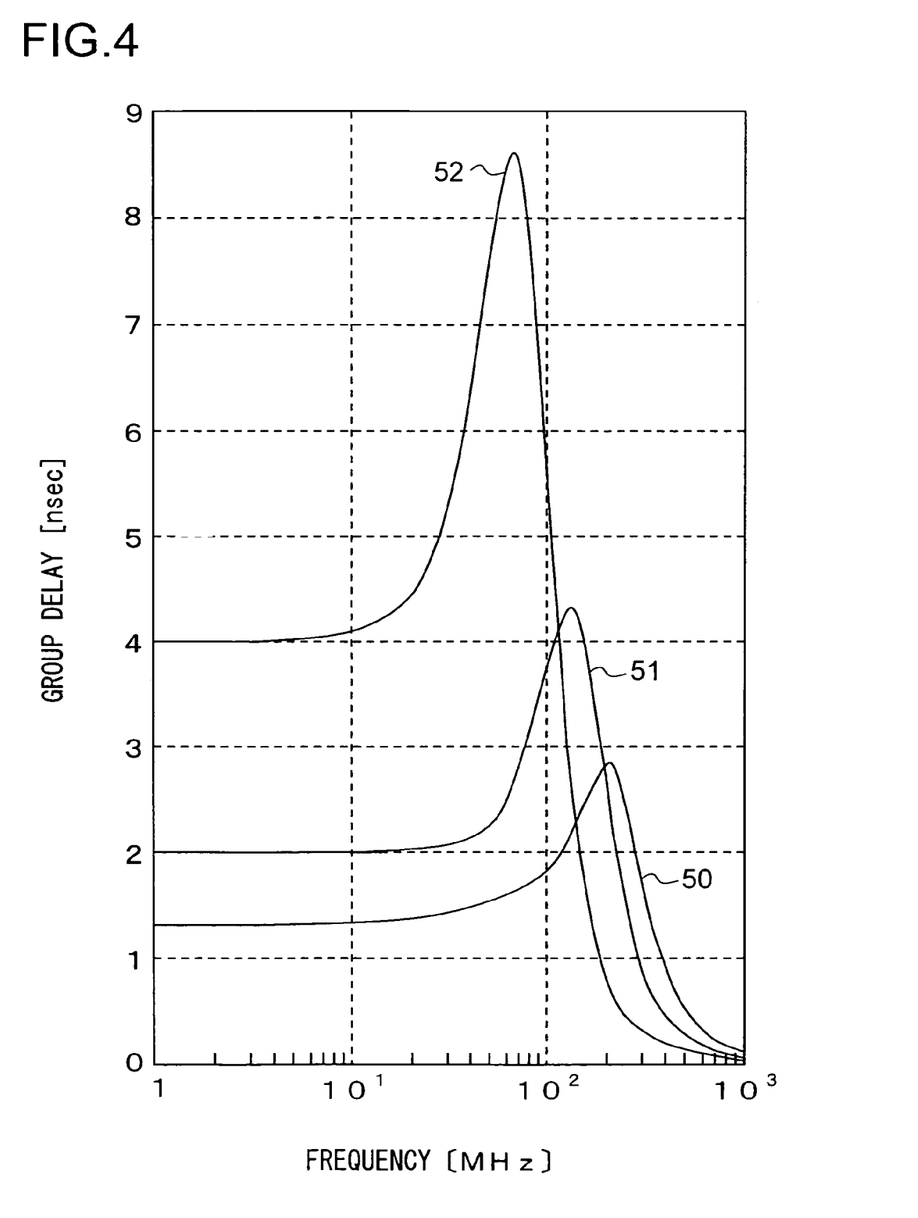
[FIG. 4] A diagram showing group delay characteristics of the all-pass filter shown in FIG. 1.

(FIGS. 3 and 4: Group Delay Characteristic Graphs)

Next, referring to FIGS. 3 and 4, the group delay characteristics of the all-pass filter 7*b* will be described. FIGS. 3 and 4 graphically represent the group delay characteristics of the all-pass filter 7*b* as calculated based on formula (5) above, with the horizontal axis representing frequency and the vertical axis representing group delay. In both FIGS. 3 and 4, it is assumed that C1=C2=1 pF (picofarad).

In FIG. 3, curves 40, 41, and 42 represent the group delay characteristics observed when (gm1, gm2)=(1.0, 1.5), (1.0, 1.0), and (1.0, 0.5) [mA/V (milliamperes per volt)], respectively. That is, curves 40, 41, and 42 show how the group delay characteristic varies when, while gm1 is kept constant, gm2 is varied.

Curve 40 shows that the group delay reaches its maximum (about 3.0 nsec) at a frequency of about 150 MHz. Curve 41 shows that the group delay reaches its maximum (about 4.3 nsec) at a frequency of about 130 MHz. Curve 42 shows that the group delay reaches its maximum (about 8.3 nsec) at a frequency of about 100 MHz. For all curves 40, 41, and 42, gm1 remains 1.0 [mA/V], and therefore, for all curves 40, 41, and 42, the group delay in the direct-current range equals 2.0 nsec (for all curves 40, 41, and 42, the group delay in a low-frequency range, namely 10 MHz or lower, equals about 2 nsec).

For example, when the all-pass filter 7b (or the waveform equalization section 7) receives a signal whose group delay at a frequency of 130 MHz is smaller than that in the direct-current range by as much as corresponds to 2.3 nsec, adjustment is performed such that (gm1, gm2)=(1.0, 1.0) to correct for the group delay difference of that signal (that is, to eliminate the difference between the group delay in the direct-current range and that at a frequency of 130 MHz).

The frequencies at which the group delay reaches its maximum on curves 40, 41, and 42 are close to one another, spreading in the range from about 100 MHz to about 150 MHz. Thus, in a case where the frequency at which the group delay should be corrected is fixed at (or previously known to be), for example, 130 MHz, by keeping gm1 constant and varying gm2, and by making the CPU 11 adjust (set) gm2 alone, it is possible to perform the adjustment easily.

On the other hand, in FIG. 4, curves 50, 51, and 52 represent the group delay characteristics observed when (gm1, gm2)=(1.5, 1.5), (1.0, 1.0), and (0.5, 0.5) [mA/V (milliamperes per volt)], respectively.

Curve 50 shows that the group delay reaches its maximum (about 2.8 nsec) at a frequency of about 200 MHz, and that the group delay in the direct-current range is about 1.3 nsec. Curve 51 shows that the group delay reaches its maximum (about 4.3 nsec) at a frequency of about 130 MHz, and that the group delay in the direct-current range is about 2.0 nsec. Curve 52 shows that the group delay reaches its maximum (about 8.6 nsec) at a frequency of about 70 MHz, and that the group delay in the direct-current range is about 4.0 nsec.

Whereas the frequencies at which the group delay reaches its maximum on curves 40, 41, and 42 in FIG. 3 are close to one another, spreading in the range from about 100 MHz to about 150 MHz, the frequencies at which the group delay reaches its maximum on curves 50, 51, and 52 differ greatly from one another. Thus, in a case where the frequency at which the group delay should be corrected is inconstant, for example varying in the range from 70 MHz to 200 MHz, by adjusting gm1 alone or both gm1 and gm2, it is possible to perform the adjustment easily.

As described above, the waveform equalization section 7 is provided with an equi-ripple filter 7a that boosts a high-frequency range and an all-pass filter 7b that compensates (corrects) for the group delay difference of the signal outputted from the equi-ripple filter 7a. Thus, the waveform equalization section 7 can independently adjust the boost factor and the group delay. This makes both adjustments easy.

Figure 5:
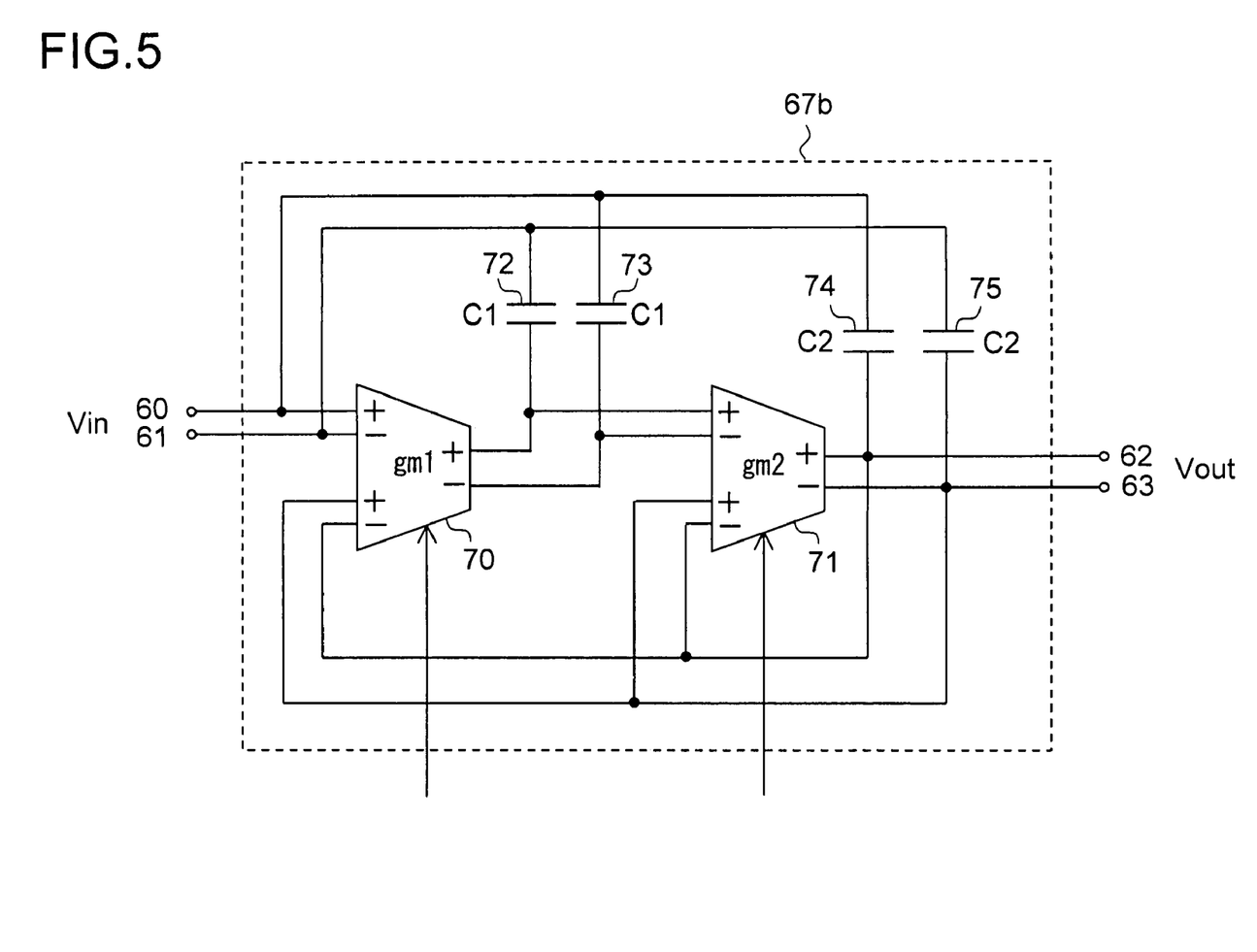
[FIG. 5] A circuit configuration diagram of a modified example of the all-pass filter shown in FIG. 1.

(FIG. 5: Modified Example of the All-Pass Filter)

Next, referring to FIG. 5, as a modified example of the practical circuit configuration of the all-pass filter 7b, an all-pass filter 67b will be described. The all-pass filter 67b may be used instead of the all-pass filter 7b used in the CD reproducing apparatus 1 shown in FIG. 1. The following description assumes that the all-pass filter 7b shown in FIG. 1 is replaced with the all-pass filter 67b.

The all-pass filter 67b has two differential-input differential-output variable-conductance amplifiers (hereinafter referred to simply as "gm amplifiers") 70 and 71. The conductances gm1 and gm2 of these gm amplifiers 70 and 71, respectively, can be individually set freely through current control or voltage control from the CPU 11 (unillustrated in FIG. 5). The output voltage Vin of the equi-ripple filter 7a is fed, with reference to a terminal 61, to a terminal 60, and this voltage Vi is fed to the differential-input terminals of the gm amplifier 71 (fed to, with reference to the negative input terminal (−) of those differential-input terminals, to the positive input terminal (+) thereof.

The terminal 60 is connected, via a capacitor 73, to the negative output terminal (−) of the differential output terminals of the gm amplifier 70 and to the negative input terminal (−) of the differential input terminals of the gm amplifier 71, and is also connected, via a capacitor 74, to the positive output terminal (+) of the differential output terminals of the gm amplifier 71 and to a terminal 62.

The terminal 61 is connected, via a capacitor 72, to the positive output terminal (+) of the differential output terminals of the gm amplifier 70 and to the positive input terminal (+) of the differential input terminals of the gm amplifier 71, and is also connected, via a capacitor 75, to the negative output terminal (−) of the differential output terminals of the gm amplifier 71 and to a terminal 63.

The voltage applied to the differential output terminal of the gm amplifier 71 is fed back to the inputs of the gm amplifiers 70 and 71. Specifically, the positive output terminal (+) of the differential output terminals of the gm amplifier 71 is connected to the negative input terminal (−) of the negative feedback input terminals of the gm amplifier 70 and to the negative input terminal (−) of the negative feedback input terminals of the gm amplifier 71, and the negative output terminal (−) of the differential output terminals of the gm amplifier 71 is connected to the positive input terminal (+) of the negative feedback input terminals of the gm amplifier 70 and to the positive input terminal (+) of the negative feedback input terminals of the gm amplifier 71.

The voltage Vout applied to the terminal 62 with respect to the voltage applied to the terminal 63 is, as the output voltage of the all-pass filter 67b, fed to the A/D converter 8 (see FIG. 1). The capacitors 72 and 73 each have a capacitance C1, and the capacitors 74 and 75 each have a capacitance C2.

Configured as described above, the all-pass filter 67b too fulfills formulae (5) to (7) noted above, and exhibits the same group delay characteristics as shown in FIGS. 3 and 4.

<<Possible Modifications Etc.>>

The embodiment described above deals with a CD as a recording medium and a CD reproducing apparatus as an information reproducing apparatus. Instead of a CD, however, it is also possible to adopt, as a recording medium: an optical or magneto-optical disc such as a CD-R (compact disc recordable), CD-ROM (compact disc read-only memory), CD-RW (compact disc rewritable), MD (minidisc), MO (magneto-optical disc), DVD (digital versatile disc), DVD-R (digital versatile disc recordable), DVD-ROM (digital versatile disc read-only memory), DVD-RW/DVD+RW (digital versatile disc rewritable), DVD-RAM (digital versatile disc random-access memory), or BD (blu-ray disc); or a magnetic disc such as a floppy disc® or hard disc. Instead of a CD reproducing apparatus, it is also possible to adopt, as an information reproducing apparatus, any information reproducing apparatus that plays back one or more of the just mentioned recording media such as an MD.

In the waveform equalization section 7 shown in FIG. 1, the all-pass filter 7b is connected in the stage following the equi-ripple filter 7a. Alternatively, the all-pass filter 7b may be connected in the stage preceding the equi-ripple filter 7a to form the waveform equalization section.

INDUSTRIAL APPLICABILITY

With a waveform equalizer and an information reproducing apparatus according to the present invention, it is possible to independently adjust the gain in the weakened frequency range and adjust the group delay, and to easily equalize a signal.

The invention claimed is:

1. A waveform equalizer comprising:
   a calculation circuit; and
   an all-pass filter that is connected to a stage preceding or following the calculation circuit, and that has a first conductance amplifier and a second conductance amplifier,
   wherein the all-pass filter is arranged to make a conductance of the second conductance amplifier variable and, by varying the conductance of the second conductance amplifier, adjusts and thereby corrects a group delay characteristic of an input signal to the waveform equalizer while keeping a group delay of the input signal in a direct-current range constant.

2. The waveform equalizer of claim 1, wherein the all-pass filter further comprises:
   a differentiator that is connected between input and output circuits of the first conductance amplifier and that includes a first capacitor and
   a second capacitor that is connected between an input side of the first conductance amplifier and an output side of the second conductance amplifier.

3. The waveform equalizer of claim 2 arranged so that
   an input voltage to the all-pass filter is fed to one input terminal of the first conductance amplifier,
   a voltage applied to an output terminal of the first conductance amplifier is fed to one input terminal of the second conductance amplifier,
   a voltage applied to an output terminal of the second conductance amplifier, which voltage corresponds to an output voltage of the all-pass filter, is fed to another input terminal of the first conductance amplifier and to another input terminal of the second conductance amplifier, and
   the input voltage to the all-pass filter and the voltage applied to the output terminal of the first conductance amplifier have phases inverted relative to each other.

4. The waveform equalizer of claim 1, wherein the all-pass filter makes a conductance of the first conductance amplifier variable, and, by varying the conductance of the first conductance amplifier, varies a frequency range in which the group delay characteristic of the input signal is corrected.

5. The waveform equalizer of claim 1, wherein the calculation circuit is arranged as an equi-ripple filter.

6. The waveform equalizer of claim 1 wherein the calculation circuit is arranged to adjust a gain for the input signal by varying an increasing factor for freely setting the gain in a predetermined frequency range for the input signal.

7. The waveform equalizer of claim 1 wherein the all-pass filter is arranged to maintain a conductance of the first conductance amplifier substantially constant.

8. An information reproducing apparatus comprising:
   a detector arranged to detect information recorded on a recording medium and then to convert the detected information into an electrical signal;
   a waveform equalizer according to claim 1 and arranged to receive the electrical signal as the input signal; and
   a processing circuit arranged to process an output from the waveform equalizer.

* * * * *